United States Patent
Mitin et al.

(10) Patent No.: US 8,994,005 B2
(45) Date of Patent: Mar. 31, 2015

(54) VERTICALLY CORRELATED CLUSTERS OF CHARGED QUANTUM DOTS FOR OPTOELECTRONIC DEVICES, AND METHODS OF MAKING SAME

(75) Inventors: Vladimir Mitin, Amherst, NY (US); Andrei Sergeyev, Snyder, NY (US); Gottfried Strasser, Pfaffstaetten (AT)

(73) Assignee: The Research Foundation for The State University of New York, Amherst, NY (US)

( * ) Notice: Subject to any disclaimer, the term of this patent is extended or adjusted under 35 U.S.C. 154(b) by 0 days.

(21) Appl. No.: 13/430,855

(22) Filed: Mar. 27, 2012

(65) Prior Publication Data

US 2012/0248412 A1    Oct. 4, 2012

Related U.S. Application Data

(60) Provisional application No. 61/468,689, filed on Mar. 29, 2011.

(51) Int. Cl.
*H01L 31/0248* (2006.01)
*H01L 29/12* (2006.01)
*B82Y 10/00* (2011.01)
*B82Y 20/00* (2011.01)
*H01L 31/0352* (2006.01)

(52) U.S. Cl.
CPC ............. *H01L 29/127* (2013.01); *B82Y 10/00* (2013.01); *B82Y 20/00* (2013.01); *H01L 31/035218* (2013.01); *Y10S 977/932* (2013.01); *Y10S 977/954* (2013.01)
USPC ........ 257/21; 257/E29.071; 438/74; 977/932; 977/954

(58) Field of Classification Search
USPC ................... 257/15, 21, E29.005, E31.033; 977/932; 438/74
See application file for complete search history.

(56) References Cited

U.S. PATENT DOCUMENTS

| | | |
|---|---|---|
| 2001/0028055 A1* | 10/2001 | Fafard et al. ................. 257/17 |
| 2002/0094597 A1 | 7/2002 | Lin et al. |
| 2010/0289061 A1 | 11/2010 | Matsukura |

OTHER PUBLICATIONS

Chou et al. "Quantum-Dot Infrared Photodetectors With p-Type Doped GaAs Barrier Layers" IEE Photonics Technology Letters vol. 17, No. 11, Nov. 2005.*
Lee et al. "Multiple vertically stacked quantum dot clusters with improved size and homogeneity" J. Phys D: Appl. Phys. 40 (2007) 198-202.*
Chou et al. "Quantum-Dot Infrared Photodetectors With p-Type Doped GaAs Barrier Layers" IEE Photonics Technology Letters V vol. 17, No. 11, Nov. 2005.*

(Continued)

*Primary Examiner* — Cheung Lee
*Assistant Examiner* — Stephen Bradley
(74) *Attorney, Agent, or Firm* — Hodgson Russ LLP

(57) ABSTRACT

Devices (e.g., optoelectronic devices such as solar cells and infrared or THz photodetectors) with a nanomaterial having vertically correlated quantum dots with built-in charge (VC Q-BIC) and methods of making such devices. The VC Q-BIC material has two or more quantum dot layers, where the layers have quantum dots (individual quantum dots or quantum dot clusters) in a semiconductor material, and adjacent quantum dot layers are separated by a spacer layer of doped semiconductor material. The VC-QBIC nanomaterial provides long photocarrier lifetime, which improves the responsivity and sensitivity of detectors or conversion efficiency in solar cells as compared to previous comparable devices.

16 Claims, 6 Drawing Sheets

(56) References Cited

OTHER PUBLICATIONS

Smowton et al. ("Characterisation of modulation doped quantum dot lasers." Proc. of SPIE vol. 61330T-1-13 (2006)).*

Pal and Towe ("Uniformly doped InAs/GaAs quantum-dot infrared photodetector structures" J. Vac. Sci. Technol. B 23(3) May/Jun. 2005, pp. 1132-1135).*

SW Lee et al. ("Modulation-doped quantum dot infrared photodetectors using self-assembled InAs quantum dots" Physica E. 7 (200) 499-502).*

Maimon et al. ("Intersublevel transitions in InAs/GaAs quantum dots infrared photodetectors" Appl. Phys. Let., vol. 73, No. 14, Oct. 5, 1998).*

Lee et al. ("Multiple vertically stacked quantum dot clusters with improved size and homogeneity" J. Phys D: Appl. Phys. 40 (2007) 198-202).*

Mitin, V. et al. Photodetectors on structures with vertically correlated dot clusters, Micro- and Nanotechnology Sensors, Systems, and Applications II, 2001, edited by Thomas George, M. Saif Islam, Achyut K. Dutta,Proc. of SPIE vol. 7679, pp. 767905-1 to 767905-9.*

SW Lee et al. "Modulation-doped quantum dot infrared photodetectors using self-assembled InAs quantum dots," 2000, Physica Edition 7, pp. 499-502.*

Mitin, V. et al. Quantum-dot infrared detector: high sensitivity due to barrier-limited photoelectron capture, Proceedings of WOCSDICE 2000. 24th Workshop on Compound Semiconductor Devices and Integrated Circuits, May 29-Jun. 2, 2000 (Abstract).

Mitin, V. et al. Sensitive quantum-dot infrared detector with barrier-limited photoelectron capture, Computational Electronics, 2000. Book of Abstracts. IWCE Glasgow, May 22, 2000. 7th International Workshop.

Maimon, S. et al. Intersublevel transitions in InAs/GaAs quantum dots infrared photodetectors, Applied Physics Letters, Oct. 5, 1998, vol. 73, No. 14, pp. 2003-2005.

Shao, J. et al. High Operating Temperature Quantum-Dot Infrared Photodetector Using Advanced Capping Techniques, IEEE Transactions on Nanotechnology, Dec. 3, 2010, vol. 10, No. 5, pp. 1010-1014.

Asgari, A. et al. High performances III-Nitride Quantum Dot infrared photodetector operating at room temperature, Optoelectronics express, Jul. 5, 2010, vol. 18, No. 14, pp. 14604-14615.

Mitin, V. et al. Photodetectors on structures with vertically correlated dot clusters, Proc. SPIE, Apr. 5, 2010, vol. 7679, 767905 (Abstract).

Mitin, V. et al. Quantum-dot photodetector operating at room temperatures: diffusion-limited capture, Physica B, 2002, vol. 316-317, pp. 369-372.

Mitin, V. et al. Infrared detector based on modulation-doped quantum-dot structures, Physica Status Solidi (C), 2006, vol. 3, pp. 4013-4016.

Mitin, V. et al. High Performance of IR Detectors due to Controllable Kinetics in Quantum-Dot Structures, Proceed. of SPIE: Nanophotonics and Macrophotonics for Space Environment II, 2008, vol. 7095, pp. 70950K1-70950K9.

Chien, L.H. et al. Hot-Electron transport in quantum-dot photodetectors, Int. J. of High Speed Electronics and Systems, 2008, vol. 18, pp. 1013-1022.

Vagidov, N. et al. Infrared quantum-dot photodetectors with diffusion-limited capture, Physics and Modeling of Tera- and Nano-Devices, editors M. Ryzhii and V. Ryzhii, 2008, World Scientific, pp. 141-148.

Chien, L.H. et al. Quantum dot photodetectors based on structures with collective potential barriers, Proceed. of SPIE: SPIE Photonics West, Connecting Minds for Global Solutions, 2010, vol. 7608, pp. 760826-1 to 760826-8.

Sergeev, A. et al. Quantum-Dot Infrared Photodetectors: In Search of Right Design for Room-Temperature Operation, will appear in Future Trends in Microelectronics, Edited by Serge Luryi, Jimmy Xu, and Alex Zaslavsky; John Wiley and Sons, 2010, pp. 385-393.

Mitin, V. et al. Quantum Dot Infrared Photodetectors: Photoresponse Enhancement Due to Potential Barriers, Nanoscale Res Lett, 2011, vol. 6:21, 6 pages.

Sablon, K. et al. Effective harvesting, detection, and conversion of IR radiation due to quantum dots with built-in charge, Nanoscale Research Letters 2011, 6:584, 13 pages.

Mitin, V. et al. Photodetectors on structures with vertically correlated dot clusters, Micro- and Nanotechnology Sensors, Systems, and Applications II, edited by Thomas George, M. Saif Islam, Achyut K. Dutta,Proc. of SPIE vol. 7679, pp. 767905-1 to 767905-9.

Sablon, K. et al. Strong Enhancement of Solar Cell Efficiency Due to Quantum Dots with Built-In Charge, Nano Lett., 2011, 7 pages.

Uppal, P.N. Quantum Well and Quantum Dot Research at the US Army Research Laboratory (ARL), Infrared Sensors, Devices, and Applications; and Single Photon Imaging II, edited by Paul D. LeVan, Ashok K. Sood, Priyalal S. Wijewarnasuriya, Manijeh Razeghi, Jose Luis Pau Vizcaíno, Rengarajan Sudharsanan, Melville P. Ulmer, Tariq Manzur, Proc. of SPIE vol. 8155, pp. 81550E-1 to 81550E-6.

* cited by examiner

VERTICALLY CORRELATED CLUSTERS OF CHARGED QUANTUM DOTS FOR OPTOELECTRONIC DEVICES, AND METHODS OF MAKING SAME

CROSS-REFERENCE TO RELATED APPLICATIONS

This application claims priority to U.S. provisional patent application no. 61/468,689, filed Mar. 29, 2011, the disclosure of which is incorporated herein by reference.

STATEMENT REGARDING FEDERALLY SPONSORED RESEARCH

This invention was made with government support under contract no. FA9550-09-C-0175 and FA9550-10-C-0103 awarded by the Air Force Office of Scientific Research. The government has certain rights in the invention.

FIELD OF THE INVENTION

The present invention generally relates to quantum dot (QD) nanomaterials. More particularly, the present invention relates to vertically correlated quantum dots and quantum dot clusters with built-in charge.

BACKGROUND OF THE INVENTION

Numerous applications, ranging from tactical and strategic defense systems (flight control, night vision, and early warning systems) to commercial technologies in public safety, industry, and healthcare require sensitive far-infrared microsensors to employ in high-density focal plane arrays. The high-temperature limitations of IR sensors are mainly conditioned by the tremendous decrease of sensitivity, caused by substantial reduction of photocarrier lifetime above liquid nitrogen temperatures. A problem for high-temperature operation of quantum well infrared photodetector (QWIP) detectors is the fast picosecond photoelectroncapture, which strongly limits the detector's responsivity and sensitivity due to significant generation-recombination noise.

One of the goals for next generation of imaging systems and solar cell photovoltaic devices is to increase the photoresponse to visible and infrared (IR) radiation. Improved electron coupling and increased carrier lifetime suppression of recombination can result in improved photoresponse. However, it is not easy to increase the radiation absorption without enhancement of recombination losses because by introducing electron levels that provide radiation-induced electron transitions inevitably creates additional channels for inverse processes that increase recombination losses.

This trade-off between absorption and recombination processes are well understood for a number of technologies and corresponding materials. For example, starting from the early sixties significant attention was attracted to semiconductors with impurities, which provide electron levels inside the semiconductor bandgap and in this way induce the IR transitions from localized impurity states to conducting states in the semiconductor material. However, midgap impurities drastically enhance the recombination processes, i.e., Shockley-Read-Hall recombination, and deteriorate the photovoltaic conversion efficiency.

To accommodate the solar spectrum and to utilize its IR portion, the modern photovoltaic technology mainly employs multi-junction cells with different electron bandgaps. In these devices each p-n junction cell is designed to effectively harvesting solar energy within a certain spectral window close to the bandgap. According to the theoretical modeling, in a multi-junction solar cell with five or more junctions the ultimate photovoltaic efficiency may exceed 70%. However, current technology enables to produce only triple-junction cells (Ge-substrate junction-InGaAs—AlInGaP) with the maximum conversion efficiency of ~40% for concentrator cells. Strong technological limitations are caused by the need for lattice match, thermal expansion match, and current match in the cascade of heterojunctions.

Quantum-dot structures are considered for use in photovoltaic nanomaterials due to their ability to extend the conversion of the solar energy into the infrared range. Up to now the most efforts were concentrated on the quantum-dot solar cell with intermediate band structure, which is formed from discrete QD levels due to tunneling coupling between QDs. Theoretical calculations predict that the intermediate band solar cell can provide efficiency of ~65%.

However, intensive experimental efforts to improve performance of the intermediate band solar cells show limited success. In comparison with a reference cell, the photovoltaic efficiency of the QD intermediate band cells increases just by 1-2% percent. It is well understood that addition of QDs significantly increases the absorption of IR radiation, but simultaneously QDs drastically increase recombination processes. For this reason, the corresponding recombination losses are hardly compensated by the conversion of IR radiation.

BRIEF SUMMARY OF THE INVENTION

The present invention provides nanomaterials with QD layers. The QD layers have vertically correlated QDs with built in charge. The QDs are present as individual QDs or QD clusters. Adjacent QD layers are separated by a spacer layer of doped semiconductor material. Also provided are methods of making the nanomaterials and devices with the nanomaterials. For example, the devices can be optoelectronic devices such as solar cells, semiconductor detectors (e.g., IR and THz detectors), and thermophotovoltaic devices.

In an embodiment, the nanomaterial comprises a plurality of QD layers, where adjacent QD layers are separated by a spacer layer of doped semiconductor material. Each QD layer comprises a plurality of QDs with built-in charge, present individually or as QD clusters, in a semiconductor material. The QDs have built-in charge and the individual QDs or QD clusters in adjacent layers are vertically correlated.

The nanomaterials have QD structures with long photocarrier lifetime. The nanomaterials exhibit suppressed capture processes and demonstrate increased photocarrier lifetime compared to bulk semiconductors, low-dimensional semiconductors, and quantum well structures. The VC Q-BIC nanomaterials of the present invention provide possibilities for controlling inter-dot kinetics of photoelectrons by means of potential barriers.

DETAILED DESCRIPTION OF THE INVENTION

The present invention provides nanomaterials with QD layers. The QD layers have vertically correlated QDs with built in charge. The QDs are present as individual QDs or QD clusters. Adjacent QD layers are separated by a spacer layer of doped semiconductor material. Also provided are methods of making the nanomaterials and devices with the nanomaterials. For example, the nanomaterials can be used in optoelectronic devices such as solar cells and infrared photodetectors.

The nanomaterials have QD structures with long photocarrier lifetime. The charge on the QDs creates potential barriers which prevent photoelectron capture by QDs. Additionally, for n-doped spacer layers, the electrons in the charged dots provide electron coupling to radiation. Without intending to be bound by any particular theory, it is considered that the photocarrier lifetime results from the built-in-dot charge on the QDs and correlation of QD positions in adjacent layers.

The nanomaterials exhibit suppressed capture processes and demonstrate increased photocarrier lifetime compared to bulk semiconductors, low-dimensional semiconductors, and quantum well structures. A scheme depicting Vertically Correlated Quantum dots with Built-In Charge (VC Q-BIC) is presented in FIG. 1. The performance of photodetectors and solar cells is directly related to the ability to control the photocarrier processes and to increase the photocarrier lifetime. Increase of photocarrier lifetime in the nanomaterials of the present invention can provide a semiconductor detector that can operate at higher temperatures (e.g., room temperature) than devices without such structures that typically operate at liquid nitrogen temperature. Also, long photocarrier lifetime can result in an increase of the photoconductive gain, which in turn increases the device responsivity. Long photocarrier lifetime also decreases generation-recombination noise and increases the device sensitivity. Improvements such as high operating temperature, high photoresponse, and high sensitivity would significantly increase the commercial market for QD photodetectors. Further, long photoelectron lifetime provides decreases in recombination losses in photovoltaic and thermophotovoltaic devices and improves their efficiencies.

Figure 2:
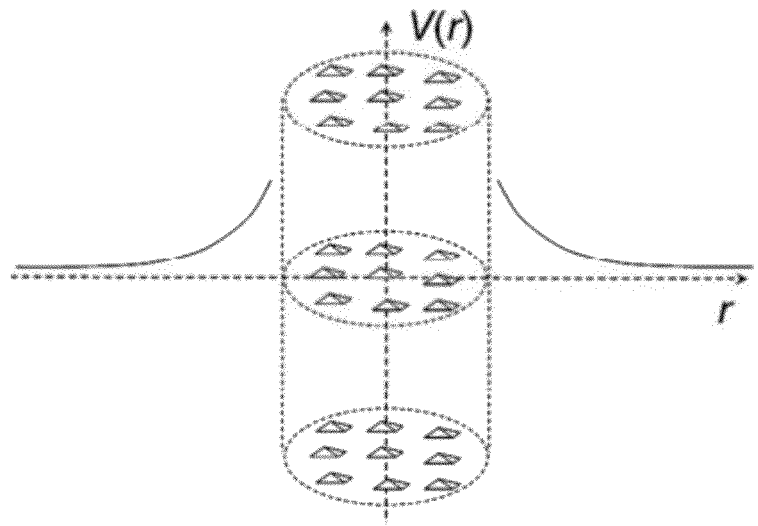
FIG. 2. Example of a potential profile in around vertically correlated clusters of QD with built-in charge (Q-BIC).

The VC Q-BIC nanomaterials of the present invention provide possibilities for controlling inter-dot kinetics of photoelectrons by means of potential barriers. Potential barriers can be created when electrons from the dopant populate the dots. For example, FIG. 2 shows local potential barriers around single dots. Local potential barriers can be created by single randomly distributed QDs with built-in charge. The barriers prevent photoelectron capture to the dots. Collective potential barriers can be created by groups of dots, e.g., correlated clusters, correlated individual QDs. Collective potential barriers around groups of QDs are more effective for separation of the QDs from the conducting channels for photoelectrons. Compared with local potential barriers, the collective potential barriers provide increased suppression of the photoelectron capture process and increase the photoelectron lifetime. By changing the electron occupation of QDs, one can manage the potential barriers around dots and control the photoelectron capture processes. Manageable kinetics opens various possibilities for developing adaptive sensors on the base of these structures.

In an aspect, the present invention provides nanomaterials with QD layers separated by a layer of spacer material. In an embodiment, the nanomaterial comprises a plurality of QD layers, where adjacent QD layers are separated by a spacer layer of doped semiconductor material. Each QD layer comprises a plurality of QDs with built-in charge, present individually or as QD clusters, in a semiconductor material. The QDs have built-in charge and the individual QDs or QD clusters in adjacent QD layers are vertically correlated.

By "QDs with built-in charge" it is meant QDs disposed in a layer of semiconductor material that is doped (e.g., n-doped or p-doped). The amount of dopant is such that the QDs are at least partially filled by electrons for n-doped semiconductor materials or holes form p-doped semiconductor materials, thus providing QDs with built-in charge. Without intending to be bound by any particular theory, it is considered the charge in the QDs creates potential barriers which prevent photoelectron capture by the QDs and/or the electrons in the charged dots provide electron coupling to infrared radiation. Optoelectronic devices based on VC Q-BIC nanomaterials can have increased photoelectron lifetime and improved coupling to IR radiation due to the QDs with built-in charge.

By "vertical correlation" or "vertically correlated" it is meant that, with respect to QD clusters, the centers of QD clusters in a QD layer are correlated to corresponding centers of QD clusters in an adjacent layer, and with respect to individual QDs, that individual QDs are correlated with corresponding individual QDs in an adjacent layer. By "adjacent layers" it is meant a first QD layer and a second QD layer directly above or below the QD layer. Adjacent layers are not in physical contact with each other (e.g., the adjacent layers are separated by a layer or layers that are not QD layers such as a spacer layer). In various embodiments, at least 50%, at least 60%, at least 70%, at least 80%, at least 90%, at least 95%, at least 99% of the QDs are vertically correlated with corresponding QDs. In other various embodiments, at least 50%, at least 60%, at least 70%, at least 80%, at least 90%, at least 95%, at least 99% of the centers of QD clusters are vertically correlated with corresponding QD clusters. In other various embodiments, at least 50%, at least 60%, at least 70%, at least 80%, at least 90%, at least 95%, at least 99% of the QDs are vertically correlated with corresponding QDs, and centers of QD clusters are vertically correlated with corresponding centers of QD clusters. In another embodiment, all of the QDs are vertically correlated. In yet another embodiment, all of the QD clusters are vertically correlated. In another embodiment, all of the QDs are vertically correlated and all of the QD clusters are vertically correlated.

For vertically correlated clusters, the average distance between centers of the nearest (i.e., shortest distance between two dot clusters) QD clusters in adjacent layers is 70% or less than that in the case of random distribution of cluster centers, e.g., less than $0.7(1/(2N_{cl})+b^2)^{1/2}$, where $N_{cl}$ is the concentration of QD clusters in a QD layer and b is the distance between layers. In various examples, the average distance between centers of the nearest QD clusters in adjacent layers is 50% or less, 40% or less, 30% or less, 20% or less, 10% or less, 5% or less, or 1% or less than in the case of random distribution of cluster centers. For vertically correlated individual QDs, the average distance between the QDs in adjacent layers is 70% or less than that in the case of random distribution of QDs in the layers, e.g., less than $0.7(1/(2n)+b^2)^{1/2}$, where n is the QD concentration in a QD layer and b is the distance between layers. In various examples, the average distance between the positions of the nearest individual QDs in adjacent layers is 50% or less, 40% or less, 30% or less, 20% or less, 10% or less, 5% or less, or 1% or less than in the case of random distribution of individual QD positions.

The QDs can be formed from various materials and have a wide range of dimensions. It is desirable that the QDs absorb light in the visible and/or infrared and/or terahertz (THz) wavelength regions. In an embodiment, the QDs absorb at least a portion of energy having a wavelength of 700 nm to 1 mm, including all values to the nm and ranges therebetween. Examples of suitable materials include, but are not limited to InAs, GaAs, Ge, SiGe, CdS, InP, PbSe, GaN, or a combination thereof. The height, width, and areal density of the QDs depends on the materials and growth conditions used to form the QDs and are not limited to any specific range. For example, the QDs can have a height (measured normal to the surface on which the QDs are disposed) of from 2 nm to 10 nm, including all values to the nm and ranges therebetween. For example, a height of from 3 nm to 5 nm is desirable for InAs QDs. The length and width of the QDs can be from 10 nm to 40 nm, including all values to the nm and ranges therebetween. A broad range of QD densities can be used. For example, the density of QDs can be from $10^{10}$ to $10^{12}$ cm$^{-2}$, including all values to the 10 cm$^{-2}$ and ranges therebetween. The QDs can be formed by methods known in the art. For example, the QDs can be formed by self-assembly methods. Examples of self-assembly methods include the Stranski-Krastanow and Volmer-Weber methods.

A broad range of QD size (e.g., length, width, and height) distributions can be used. For example, the relative full-width at half maximum (FWHM) of the QD size (e.g., length, width, or height) distribution can be from 10% to 70%, including all integer % values and ranges therebetween.

The QDs are present individually or as clusters of QDs. The QD clusters are groups of QDs, where each cluster is separated by a distance which exceeds the interdot space in an individual cluster. If the QDs are present as clusters of QDs, each QD layer has at least one cluster of QDs. The nanomaterial can have a range of QDs per cluster and QD clusters per layer. The number of QDs per cluster and number of QD clusters per layer can vary depending on the QD materials and doped semiconductor material. For example, the QDs per cluster can be from 2 to 15, including all integer numbers of QDs therebetween. For example, the number of clusters per layer can be from $10^8$ to $10^{12}$, including all values to the 100 clusters per layer and ranges therebetween.

The distance between nearest QDs in a cluster can vary. The distance between nearest dots in a cluster is the shortest distance from the nearest boundaries of nearest QDs in a cluster. For example, the distance can be from 1 to 5 nm. The distance between nearest QD clusters can also vary. The distance between nearest QD clusters is the shortest distance from the boundaries of nearest QD clusters. For example, the distance between nearest QD clusters can be from 3 to 5 times the distance between nearest QDs in the clusters.

The VC Q-BIC nanomaterial has a plurality of QD layers. Each QD layer has individual QDs or clusters of QDs disposed in a semiconductor material. For example, the QD layer can have QDs and semiconductor material filling the interstitial space around the QDs. For example, the nanomaterial can have from 2 to 50 such layers, including all integer numbers of layers and ranges therebetween. In an embodiment, the QD layer has a layer of the QD material (e.g., a monolayer of the QD material) and the QDs are in contact with the layer of QD material.

The layers of semiconductor materials (e.g., QD layers and spacer layers) can be formed from a variety of semiconductor materials. Such materials are semiconducting. Examples of suitable semiconductor materials include, but are not limited to, GaAs, InP, Si, $BaF_2$, $CaF_2$, and SiC. The layers can be n-doped, p-doped, or undoped as desired. The doping level is within the purview of one having skill in the art.

The thickness of an individual QD layer can vary. For example, the thickness of an individual QD layer can be from 2 nm to 10 nm, including all integer numbers of nm therebetween. For example, the thickness of the QD layer is equal to the height of the largest QD in the layer. The There is no requirement that intermediate bands be formed. Thus, in an embodiment, the thickness of the layers is such that intermediate bands are not formed. In an embodiment, the thickness of the spacer layers is large enough (e.g., 20 nm or greater in InAs QD/GaAs structures) to minimize stress and formation of defects, which increases recombination losses.

The spacer layers between adjacent QD layers are doped semiconductor materials. The spacer layers do not contain QDs. The semiconductor material can be n-doped or p-doped. For example, GaAs solar cells with such n-doping have increased the conversion efficiency as compared to the same device without such n-doping or direct doping of QDs. The thickness of individual spacer layers can be from 15 nm to 50 nm, including all values to the nm and ranges therebetween.

By "electrons per dot" it is meant that the amount of n-dopant averaged over a spacer layer corresponds to the number of electrons per dot. For example, the doping level can correspond to two electrons per dot to thirty electrons per dot, including all integer electrons per dot values and ranges therebetween. Thus, in various embodiments, the layer is doped such that the dopant concentration in the layer is equivalent to at least two electrons per dot, at least three electrons per dot, at least four electrons per dot, at least five electrons per dot, or at least six electrons per dot. By "holes per dot" it is meant that the amount of p-dopant averaged over a spacer layer corresponds to the number of holes per dot. For example, the p-doping level can correspond to two holes per dot to thirty holes per dot, including all integer holes per dot values and ranges therebetween. Thus, in various embodiments, the layer is doped such that the dopant concentration in the layer is equivalent to at least two holes per dot, at least three holes per dot, at least four holes per dot, at least five holes per dot, or at least six holes per dot.

In an embodiment, the dopant each QD layer in the VC Q-BIC nanomaterial is substantially localized in a discrete region of a spacer layer. This discrete region can have a thickness of from 1 nm to 100 nm, including all values to the nm and ranges therebetween. For example, this discrete region can be a selectively-doped layer or a δ-doped layer within the spacer layer. Without intending to be bound by any particular theory, it is considered that devices with such regions or layers have increased potential barriers around the dots.

In an embodiment, the nanomaterial comprises discrete layers of a plurality of QDs, spacer layers, and a discrete layer of dopants (e.g., a selectively-doped layer or a δ-doped layer). In an embodiment, the dopants are only in a discrete region or discrete sub-layer (e.g., a selectively-doped layer or a δ-doped layer) of the semiconductor material.

By "substantially localized" it is meant at least 90% of the n-dopant in the spacer layer is in a discrete region or a discrete sub-layer of the semiconductor material. In various embodiments at least 95%, at least 96%, at least 97%, at least 98%, at least 99% or 100% of the n-dopant is in the region or layer of the semiconductor material.

The δ-doped layer is a discrete sub-layer of n-doped semiconductor material in the spacer. This layer can have a thickness of from 1 nm to 10 nm, including all values to the nm and ranges therebetween. For example, the δ-doped layer boundary can be from greater than or equal to 5% of the total thickness of the spacer layer from either boundary of the spacer. For clarity, if the thickness of the layer is 100 nm, the δ-doped layer boundary can be from 5 nm or greater from either boundary of spacer. In another example, the center of the δ-doped layer is substantially equidistant from either boundary of the spacer. In this instance, by "substantially equidistant" it is meant that the center of the δ-doped layer is at a distance of 10% or less of the total thickness of the spacer from the center of the spacer layer. In various embodiments, the center of the region is at a distance of 5% or 1% or less from the center of the layer.

The VC Q-BIC nanomaterial can have additional layers of materials. Materials/layers having desirable properties are known in the art. For example, the nanomaterial can have additional layers such as wetting layers, liner layers, and fence layers.

The nanomaterials exhibit desirable properties. For example, the nanomaterials can have improved properties relative to bulk semiconductors, low-dimensional semiconductors, and quantum well structures. In various examples, the nanomaterials exhibit a photoelectron lifetime and/or photoconductive gain and/or responsivity that is at least 10 times, 25 times, 50 times, 100 times, 500 times, or 1000 times greater than that exhibited by comparable bulk semiconductors, low-dimensional semiconductors, and quantum well structures, if such properties are exhibited by the particular nanomaterial. In various examples, the nanomaterials exhibit a sensitivity (which can be measured as noise equivalent power or detectivity) that is at least 10 or at least 100 times greater than that exhibited by comparable bulk semiconductors, low-dimensional semiconductors, and quantum well structures, if such a property is exhibited by the particular nanomaterial.

The VC Q-BIC nanomaterials can be fabricated by various methods. The nanomaterials can be made using methods known in the art. For example, QD nanostructures can be grown on patterned substrates. The patterning profile, etch depth of the pattern, and growth parameters of the epitaxial layer structure can control the clustering of QDs. The dots align with the pattern of preferential nucleation spots. Different QD alignments, from single QD ordering to clustering of QD arrays, allow for fabrication of different pattern sizes and profiles. As another example, a doped layer of semiconductor material can be produced during formation of the semiconductor material layer using molecular beam epitaxy (MBE) or metal-organic chemical vapor deposition (MOCVD) methods.

The semiconductor substrate can be any of any semiconductor material on which the QD layers and spacer layers of the nanomaterial can be formed. The substrate can have a range of sizes and shapes. Examples of suitable materials include, but are not limited to, GaAs, InP, Si, $BaF_2$, $CaF_2$, or SiC. An example of a substrate is a Si or GaAs wafer suitable for use in semiconductor fabrication processes known in the art. For example, the substrate can be patterned such that vertically correlated QDs can be formed. The substrate can be patterned by methods known in the art. Methods such as mechanical methods and optical methods (e.g., photolithographic methods) can be used.

In an embodiment, VC Q-BIC nanomaterial is fabricated by: a. depositing a first layer of first semiconductor material on a patterned substrate; b. depositing a layer of QD material, such that a plurality of QDs is formed; and c. depositing a second layer of second semiconductor material and doping (e.g., n-doping or p-doping) the layer, or depositing a second layer of second semiconductor material such that the second layer of second semiconductor material is doped (e.g., n-doping or p-doping). Optionally, steps a., b., and c. are repeated. For example, the steps can be repeated from 2 to 50 times. The first and second semiconductor materials can be the same semiconductor materials or different semiconductor materials.

The semiconductor materials can be deposited by methods known in the art. For example, the layers of semiconductor material can be deposited by MBE or MOCVD methods. The layers can be doped (e.g., n-doped or p-doped) by methods known in the art. The layers can be doped during deposition or after deposition. Determining conditions which result in the desired doping levels for the various layers is within the purview of one having skill in the art.

The QD material is the material from which the QDs are formed. For example, a layer of InAs is deposited to form InAs QDs. The QD material can be deposited by methods known in the art.

The QDs can be formed by a variety of methods known in the art. The QDs can be formed using methods based on self-assembly, such as, for example, the Stranski-Krastanow or Volmer-Weber methods. The Stranski-Krastanow method is an epitaxial method that efficiently creates a lattice-mismatch strain between the dots and the bulk matrix while minimizing lattice damage and defects. This method is sometimes referred to as the "self-assembled quantum dot" technique. In this method, the self-assembled QDs appear spontaneously, substantially without defects, during crystal growth with MOCVD or MBE. Using growth conditions of the Stranski-Krastanow method, it is possible to create arrays of QDs with high sheet density ($>10^{10}$ cm$^{-2}$).

In an embodiment, the QDs are deposited by a self-assembly method. For example, 1.7 to 3.5 monolayers of a material such as InAs are deposited on a layer of semiconductor material such that QDs grow spontaneously.

In an embodiment, the layer of second semiconductor material, i.e. the spacer layer, is selectively doped. For example, a n-doped or p-doped layer of second semiconductor material can be formed by depositing a discrete region (e.g., a selectively-doped layer or a δ-doped layer) of n-doped second semiconductor material as part of the deposition of the layer of second semiconductor material.

In an embodiment, the Q-BIC layer (e.g., having a selectively-doped layer or a δ-doped layer) is fabricated by: a. depositing a first layer of second semiconductor material; b. depositing a layer of QD material, such that a plurality of QDs is formed; c. depositing a second layer of second semiconductor material; d. depositing a third layer of second semiconductor material, such that the layer is n-doped; and e. depositing a fourth layer of second semiconductor material. Optionally, steps a., b., c., and d. are repeated. For example, the steps can be repeated from 2 to 50 times. Steps c., d., and e. form a selectively-doped layer or a δ-doped layer.

In an aspect, the present invention provides devices with the VC Q-BIC nanomaterial. For example, the devices can be optoelectronic devices such as solar cells, semiconductor detectors (e.g., IR and THz detectors), and thermophotovoltaic devices. The devices may also have a substrate and a layer or layers of semiconductor material (e.g., buffer layers between the QD layers and the contacts). For example, the individual layers can, individually, each be n-doped semiconductor material, p-doped semiconductor material, or an undoped semiconductor material. The layers (e.g., a stack of layers) of the nanomaterial can be disposed on a substrate. In an embodiment, the device comprises VC-QBIC nanomaterial.

The substrate can be any of any semiconductor material on which the stack of layers can be formed. The substrate can have a range of sizes and shapes. Examples of suitable materials include, but are not limited to, GaAs, InP, Si, $BaF_2$, $CaF_2$, or SiC. An example of a substrate is a Si or GaAs wafer suitable for use in semiconductor fabrication processes known in the art.

The layers of semiconductor materials, which are not spacer layers, in the devices can be formed from a variety of semiconductor materials. Examples of suitable semiconductor materials include, but are not limited to, GaAs, InP, Si, $BaF_2$, $CaF_2$, and SiC. The semiconductor layers can have a broad range of thicknesses. For example, the layers can, each independently, be from 0.2 micrometers to 10 micrometers, including all values to the 0.1 micrometer and ranges therebetween.

Optionally, the optoelectronic device can comprise other layers. For example, the device can comprise layers such as electrodes, anti-reflecting coating layer, and back-surface field barriers. The device can be used in combination with solar energy concentrators.

In an example, the device is a semiconductor detector (e.g., a photodetector such as an infrared photodetector or a THz photodetector). Such devices are known in the art. In an embodiment, the device comprises metallic contacts and, optionally, buffer layers between which VC Q-BIC nanomaterial and contacts are disposed.

In an embodiment, a method for making a semiconductor detector comprises the following steps of: a. providing a patterned semiconductor substrate; b. depositing a layer of n-doped semiconductor material; c. fabricating VC Q-BIC nanomaterial; d. depositing a layer of n-doped semiconductor material. Various buffer and alignment layers may be added.

In another example, the device is a photovoltaic device (e.g., a solar cell). Such devices are known in the art. In an embodiment, the photovoltaic cell comprises the following layers: a semiconductor substrate having disposed thereon a stack of layers. The stack of layers comprises: a. a layer of n-doped or p-doped first semiconductor material, b. a VC Q-BIC nanomaterial, and c. a layer of p-doped or n-doped third semiconductor material where if the first semiconductor material is n-doped the third semiconductor material is p-doped and if the first semiconductor material is p-doped the third semiconductor material is n-doped.

Optionally, the methods of making the devices can comprise additional steps. For example, the method can comprise deposition of layers such as electrodes, anti-reflecting coating layer, and back-surface field barriers.

The following examples are presented to illustrate the present invention. They are not intended to limiting in any manner.

EXAMPLE 1

The following is an example of design and investigations of the VC Q-BIC nanomaterial of the present invention.

Figure 1:
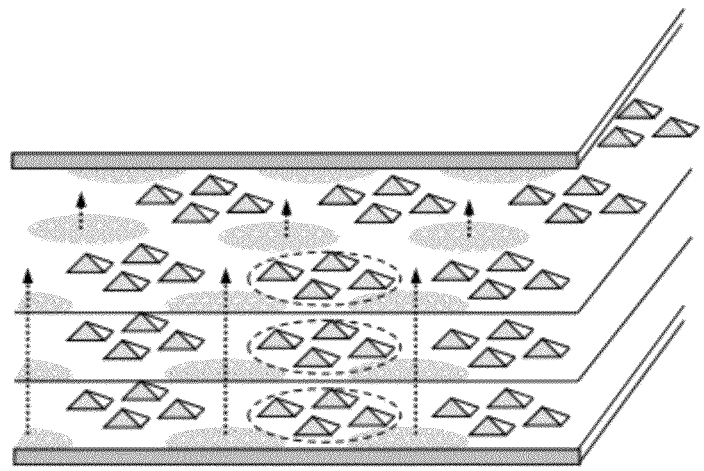
FIG. 1. Scheme of nanomaterial with clusters of vertically correlated QD with built-in charge (VC Q-BIC).

In this VC Q-BIC nanomaterial, collective barriers around QD clusters are created by charged dots. Positions of QD clusters are correlated in the direction of the electric current (i.e. in the vertical direction). In this case, the barriers separate the conducting electron states in the matrix from the localized states in QDs. Having been excited by radiation, photoelectrons move in the areas between dot clusters via highly conducting channels, separated from QDs by potential barriers, as shown in FIG. 1.

In the VC Q-BIC nanomaterial (FIG. 1) the positions of QD clusters in each layer are correlated in the vertical direction, i.e., in the direction of photocurrent. The collective barriers around the dot clusters are formed by the carriers in the dots. The barriers separate the conducting channels in the matrix and the localized electron states in QDs and therefore could suppress the electron capture into dots. Once the electrons are excited by the radiation, electrons drift in the areas between dot clusters through high-mobility conducting channels, as the dash arrows shown in FIG. 1. In what follows the detailed arrangement of dots in the clusters is not critical. The only assumption accepted here is that electrons tend to localize outside the dot clusters due to potential barriers formed by charged dot clusters and therefore the electrons feel the charged dot clusters like a line charge. Therefore the form of the potential barriers is similar to the line charge, as it is shown in FIG. 2. The conducting channels in VC Q-BIC material have a form of hollow cylinder. Here the photoabsorption area is separated from the conducting channels and in this way suppresses the capture processes. If the radius of the cluster, b, exceeds the distance between dot planes, c, the potential barrier around clusters has a logarithmic form $V_m = e2Nn/(2\pi\epsilon\epsilon_0 c)\ln(w/b)$, where N is the number of QDs in the cluster, n is the average occupation in the dot, and 2w is the distance between the centers of the nearest two clusters. In the following results, N=9, b=75 and c=40. The distance between the dots is ~55 nm. Since the barrier height is determined by the dot concentration and dot occupation, the capture time exponentially increases with these factors. Besides, the capture processes are weakly sensitive to geometrical parameters w and b due to logarithmic dependence.

Modeling of photocarrier kinetics in VC Q-BIC material shows that the photocarrier capture time exponentially increases with increasing of the number of dots in a cluster. It also exponentially increases as the occupation of a dot increases. Compared with bulk semiconductor materials, low-dimensional semiconductors, quantum well structures, and ordinary quantum-dot structures (where the photoelectron lifetime at room temperatures is of the order of 1-10 ps) the VC Q-BIC structures allow for increasing the lifetime up to three orders of magnitude (see below).

The photoelectron lifetime, i.e., the photocarrier capture time in QD structures, is an important parameter of QDIP. The limiting values of the noise equivalent power, NEP, and detectivity, D*, are determined by the generation-recombination noise, which is controlled by the capture processes, $$NEP = \frac{h\nu}{\eta}\sqrt{\frac{2n_{th}V}{\tau_{cap}}}, \quad D^* \equiv \frac{\sqrt{S}}{NEP_{GR}} = \frac{\eta}{h\nu}\sqrt{\frac{\tau_{cap}}{2n_{th}d}}, \quad (1)$$

where $\eta$ is the total quantum efficiency, $n_{th}$ is the density of the thermally activated electrons in conducting states, V, S, and d are the sensor volume, area, and width, respectively. In weak electric fields, the capture rate, $\tau_{cap}^{-1}$, may be calculated analytically. Calculations show that it depends exponentially on the value of the barrier height, $V_m$, $$\frac{1}{\tau_{capt}} = \frac{1}{\tau_0}\exp\left(-\frac{eV_m}{kT}\right), \quad (2)$$

where $\tau_0^{-1}$ is the capture time in the flat potential. The parameter $\tau_0^{-1}$ depends on the dot concentration, $N_d$, the characteristic dot size, a, with respect to the electron mean free path, l, and positions of QDs. For example, in the case of homogeneous dot distribution over the sensor and if a<<l, $$\frac{1}{\tau_0} = \pi N_d a^3 \frac{1}{\tau_\varepsilon}, \quad (3)$$

where $\tau_\varepsilon$ is the electron-phonon relaxation time. In the opposite case, a>>l, the capture time in the flat potential is given by $$\frac{1}{\tau_0} = 4\pi N_d D a, \quad (4)$$

where $D=\tilde{v}l/3$ is the diffusion coefficient.

Analytical consideration of photoelectron kinetics is limited by small electric fields. To minimize the photoelectron transit time and to increase the photoconductive gain, QDIPs operate at significant biased voltages, which substantially change the photoelectron distribution functions. For modeling of photoelectron kinetics in VC Q-BIC structures, the Monte Carlo method was used. The Monte-Carlo program includes all basic scattering mechanisms, such as electron scattering on acoustic, polar optical, and intervalley phonons. The program considers electrons which may populate in Γ-, L-, and X-valleys and takes into account redistribution of carriers between valleys created by charged dots. The carrier capture process as a specific inelastic scattering process was considered, which is confined in space by the dot volume and in which a carrier is transferred from a conducting state above the potential barrier to a bound state below the barrier. From a bound state a carrier will relax to the deep dot states faster than it could return back to the conducting state.

Figure 3:
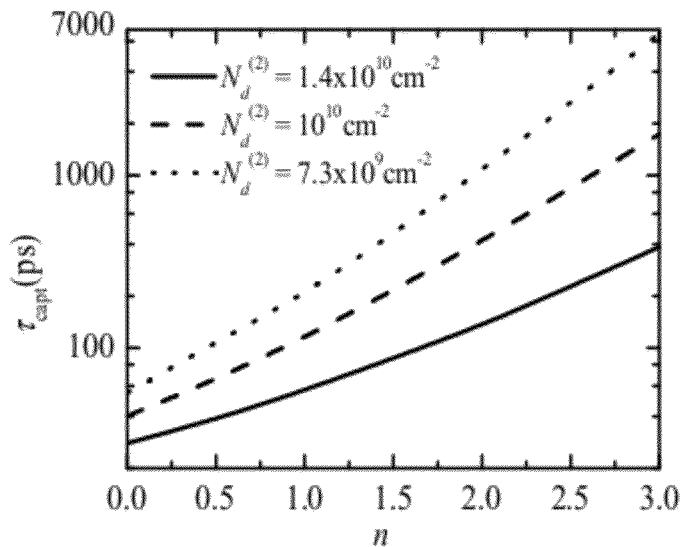
FIG. 3. The capture time (photoelectron lifetime) for a VC Q-BIC nanomaterial as a function of the built-in-dot charge (number of electrons captured in a dot).

A large occupation in QDs is desirable since it increases the absorption strength of the radiation and could be determined by the doping concentration and applied bias. However, a large built-in dot charge is hard to implement, since it requires large QDs due to the discreteness of localized states in QDs. FIG. 3 demonstrate the exponential dependence of the capture time (i.e. photoelectron lifetime) as a function of the built-in-dot charge. This dependence is explained by the linear dependence of potential barrier height vs the built-in-dot charge (see FIG. 4) and by the exponential dependence of capture time on the potential barrier height (see equation 2). Since potential barrier has a logarithmic dependence on w, the photoelectron capture time weakly depends on this geometrical parameter. At the same time, large built-in-dot charge provides large charge of QD clusters and large potential barriers around clusters, which effectively prevent the photoelectron capture to the dots and increase the photoelectron lifetime.

Figure 5:
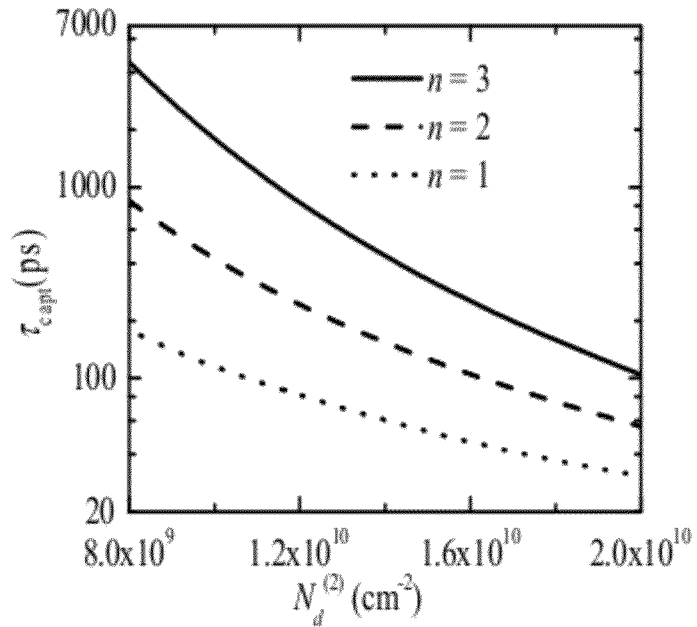
FIG. 5. The capture time (photoelectron lifetime) in a VC Q-BIC nanomaterial as a function of the dot concentration in QD planes.

FIG. 5 shows the dependence of capture time (photoelectron lifetime) on dot concentration. Modern fabrication technologies can produce QDIPs with dot concentration ~$10^9$-$10^{11}$ dots/cm$^2$. At fixed built-in-dot charge, n, the potential barrier height decreases slightly with increasing of the dot concentration due to logarithmic dependence on w. Therefore, the capture time decreases with increase of the dot concentration. In other words, smaller dot concentration, which means less trapped centres, provides less capture probability, as it is shown in FIG. 5.

Figure 6:
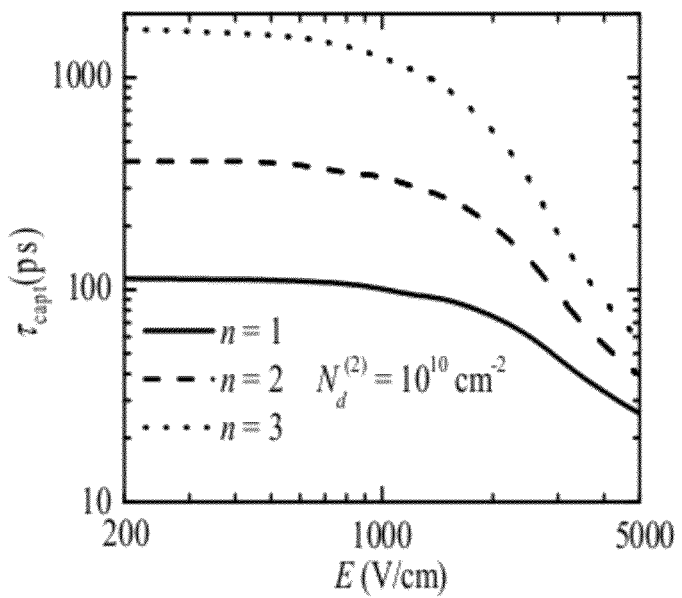
FIG. 6. The capture time (photoelectron lifetime) in a VC Q-BIC nanomaterial as a function of the electric field.

FIG. 6 represents the capture time (photoelectron lifetime) as a function of electric field for three values of the built-in-dot charge. In order to contribute to the photocurrent, photoexcited carriers are driven by the applied bias. At small electric field, photocarriers are accelerated and the drift velocity linearly increases. When the electric field reaches a characteristic value, which is of the order of $10^3$ V/cm, the electric field effectively heats the electrons. Electron heating increases an average energy of photoelectrons, which allows them to overcome potential barriers. Therefore, in the electric fields above ~$10^3$ V/cm the capture time decreases dramatically.

Figure 7:
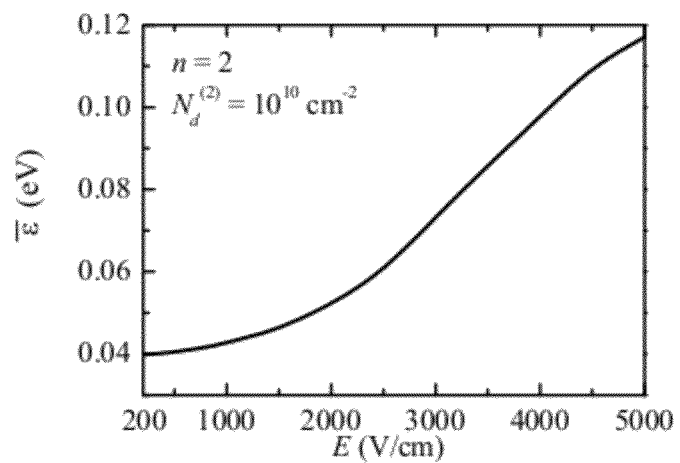
FIG. 7. Average electron energy in a VC Q-BIC nanomaterial as a function of electric field.

FIG. 7 shows the average electron energy as a function of the electric field, as it was found from the Monte-Carlo modelling. The average electron energy may be also evaluated from the energy balance equation, if one assumes that the nonequilibrium electron distribution function is described by electron temperature. Both numerical and analytical provide consistent results.

Figure 8:
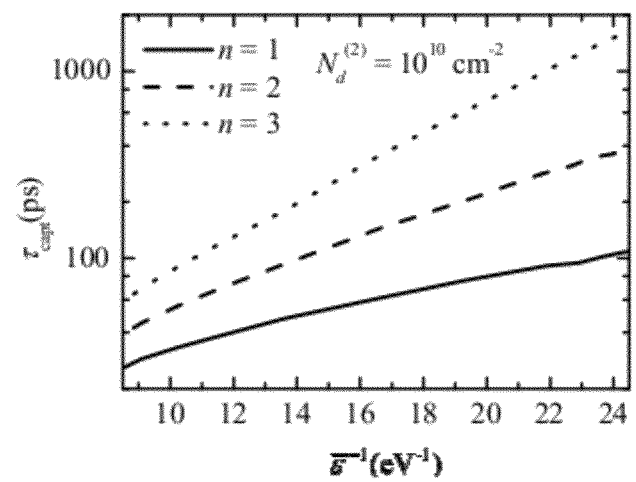
FIG. 8. Capture time as a function of inverse of the average electron energy gained by photoelectrons in the electric field in a VC Q-BIC nanomaterial.

FIG. 8 shows the dependence of the capture time (photoelectron lifetime) on the inverse of average electron energy for three values of the built-in-dot charge. The result demonstrates that the capture time is proportional to $\exp(1/\bar{\epsilon})$. Thus, the carrier capture in the electric field can be described by Eq. 2, where the thermal energy kT is replaced by a factor of ~2$\bar{\epsilon}$/3. Thus, the effect of the electric field on the photoelectron lifetime is well described by the model of electron heating.

Figure 9:
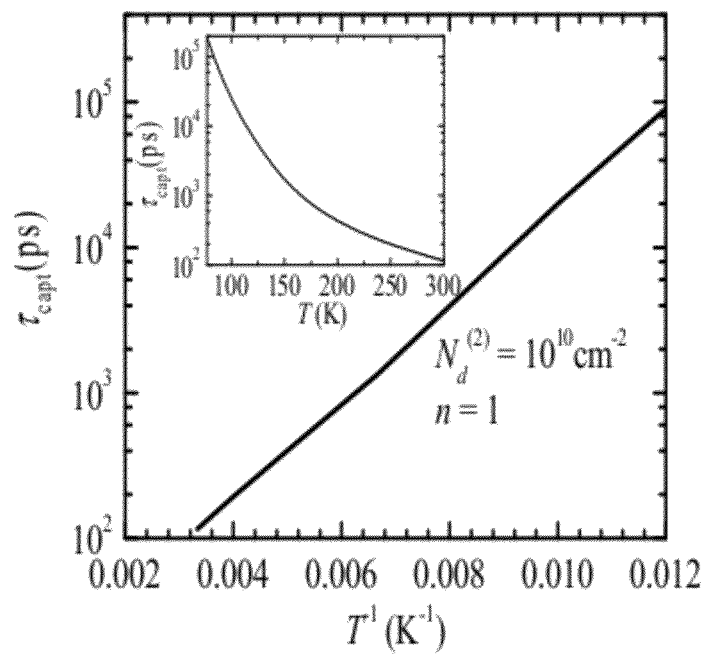
FIG. 9. Capture time (photoelectron lifetime) in VC Q-BIC nanomaterial as a function of inverse temperature and temperature (insert).

FIG. 9 shows the dependence of the capture time on the temperature at fixed potential barrier. The capture time is proportional to the exponent of 1/T, as it is described by Eq. 2. At all temperatures the large barriers can effectively suppress the capture processes.

Figure 10:
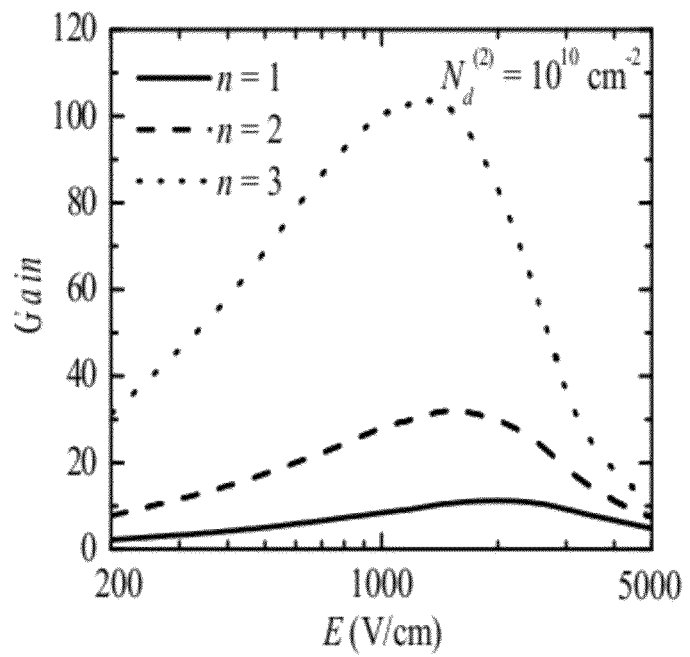
FIG. 10. The photoconductive gain in a VC Q-BIC nanomaterial as a function of the electric field.

FIG. 10 presents the photoconductive gain, g, as a function of the electric field for a device with the length of 1 μm is presented. Photoconductive gain is defined as the ratio of the carrier lifetime, $\tau_{cap}$, to carrier transit time, $\tau_{tr}$. Transit time is the time that the electron spends in the device moving from the emitter to the collector and, therefore it is inversely proportional to the drift velocity. The average drift velocities have been calculated using the same Monte Carlo program that was employed to find the field dependence of the electron capture time. As seen in the FIG. 10, the gain approaches a maximum value at electric field of the order of $10^3$ V/cm, which is also the characteristic field for the dependences shown in FIG. 7. This nonmonotonic dependence on the electric field may be explained in the following way. At small electric fields, the gain increases with increasing of the electric field, since the transit time reduces and capture time remains almost constant. When the electric field increases up to a characteristic value, transit time almost saturates and capture time reduces substantially and, therefore, the gain decreases substantially.

Fabrication of VCDC structures is based on the Stranski-Krastinow method. Using the Stranski-Krastinow approach, self-assembled semiconductor quantum dots has been previously reported for the InAs/GaAs material system, where InAs QDs were grown by molecular-beam epitaxy (MBE) and the successful overgrowth of the InAs QDs with GaAs, the vertical stacking of the QDs, and a photoluminescence peak at 1.15 eV (FWHM 50-100 meV) were achieved. Up to today the InAs/GaAs material system remains the most studied, but self-assembled semiconductor QDs are not limited to just this system.

Characterization of the InAs QD growth mechanism was achieved through the use of a shadow mask and a non-rotated substrate during InAs deposition, where the critical thickness for InAs QDs on a GaAs surface was determined to be 1.5 ML. The QD density begins in the 106 cm−2 range and after an additional 0.021 MLs is in the 108 cm−2 range. This dependence of QD density on ML deposition continues until 1.9 MLs and a density of 4×1010 cm−2, beyond which the QDs begin to ripen or grow in size. To achieve the 3D confinement, self-assembled semiconductor QDs are produced with low bandgap material in a higher bandgap matrix. For the GaAs-based material system, these are InAs-based QDs in an $Al_xGa_{1-x}As$ matrix where AlAs and GaAs can be alloyed with the InAs to control the QD composition and size. InAs QDs on AlAs surfaces have been studied and the critical thickness for QD nucleation was found to be almost identical to that on GaAs surfaces. The QD ensemble peak photoluminescence (PL) energy for the AlAs matrix was blue shifted approximately 400 meV from the GaAs matrix. A growth interruption after InAs deposition on the GaAs surface did not change the QD energy observed in PL, therefore the QDs stabilize quickly, but the same growth interruption on the AlAs resulted in a significant red shift of 100 meV. The reduced In surface diffusion on AlAs was determined to limit or slow down the QD growth and thus the longer time before the stable surface. Variations in As4 beam equivalent pressure (BEP) corroborate this observation. Additionally, inhomogeneous broadening was observed in temperature dependent PL of InAs QDs in $Al_xGa_{1-x}As$, indirectly indicating a broader dot size distribution than the GaAs matrix.

By using a low growth rate and careful control of the substrate temperature during growth, decoupling of InAs quantum dot size and density on $Al_xGa_{1-x}As$ surfaces can be achieved.

Here QD samples are grown by molecular-beam epitaxy (MBE) on epitaxy-ready nominally on-axis (100) GaAs substrates. The oxide is thermally desorbed. Substrate temperature is measured with a calibrated pyrometer. The substrate temperature during the dot formation is set between 490 and 520° C. and allowed to stabilize for up to 20 minutes. The sample surface, QD size, shape, and density are analyzed by atomic force microscopy (AFM).

Photoluminescence (PL) measurements are performed to determine the bandgap of the $Al_xGa_{1-x}As$ matrix, the energy level of the InAs wetting layer, and the energy levels of the QDs within the $Al_xGa_{1-x}As$ matrix. The substrate temperature is kept constant from the start of the first QD layer through each spacer layer.

Figure 4:
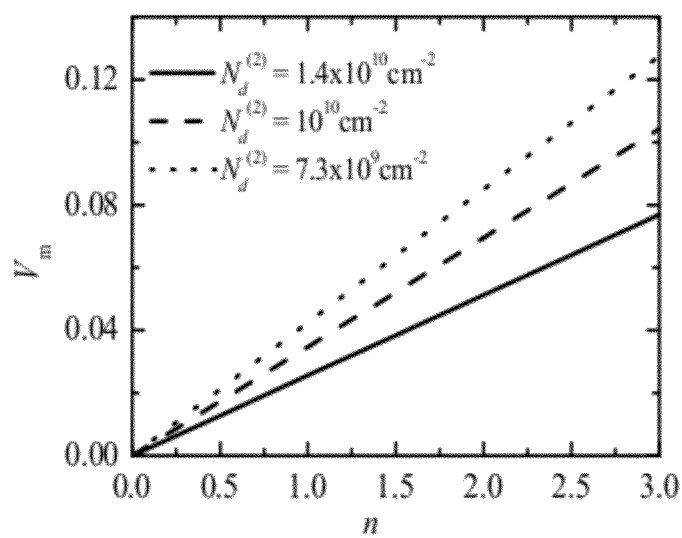
FIG. 4. Example of the height of the potential barriers (FIG. 2) as a function of the built-in-dot charge.

It has been reported that the QD growth rate determines the QD nucleation density, therefore the first step to controlling QD density is to control the growth rate. FIG. 4 shows the QD density measured by AFM for an InAs growth rate of 0.05 µm/h at 500 and 510° C. and for the growth rate of 0.01 µm/h at 500° C. For the faster InAs deposition rate at 500° C. the QD density increases with increasing InAs deposition. Raising the substrate temperature by 10° C. reduces the QD density, but still has a strong dependence on the InAs deposition thickness. It appears that the QD size and density are not independent factors under these growth conditions. By lowering the growth rate to 0.01 µm/h the QD density is relatively independent of the InAs deposition thickness. The reduced growth rate makes QD size a tunable factor by adjusting the InAs thickness, but it does not provide a method for controlling the QD density.

The growth of quantum dot nano-structures on patterned substrates has already shown promising results. Apart from e-beam lithography, maskless patterning of GaAs substrates with FIB and laser holography has been investigated. Using a focused ion beam offers the advantage that the patterns can be written directly onto the substrate and no lithographic processing is needed. As has been shown previously, FIB micro-patterning results in selective sputtering of arsenic, causing Ga-rich precipitations on the surface. For single dot milling these, in principle, mobile precipitations are fixed in the center of the crater. Regarding overgrowth, these precipitations can prevent the growth of crystalline In(Ga)As on the bottom of the holes. Post-exposure annealing followed by wet chemical etching to remove Ga contamination due to ion beam exposure was shown to solve the problem. For laser holography a laser (like a He—Cd laser at a wavelength of 325 nm) is used as an ultraviolet (UV) light source. The period of the pattern is determined by the incident angle between the laser optics and the substrate. After coating a GaAs substrate with photoresist it has to be exposed in a holographic apparatus twice, rotated 90 after the first exposure. Subsequently, the nano-scale grid patterns have to be transferred onto the GaAs using wet chemical or dry etching. Among the lithographic techniques for pattern preparation, the most common is electron beam lithography, usually ex situ followed by either plasma enhanced dry etching or wet chemical etching. To fabricate dot clusters structure sizes in the range of 200 nm to 500 nm have to be transferred into GaAs substrates by wet or dry etching methods. The etching itself should result in a smooth surface with a total etch depth of 20 nm to 30 nm. When the total etch depth is to shallow, thermal oxide removal before the epitaxial growth and the first monolayers flatten the surface and the pattern information is not conserved, etch depth profiles well above the given numbers result in 3D structures and uncontrolled dot formation.

Figure 12:
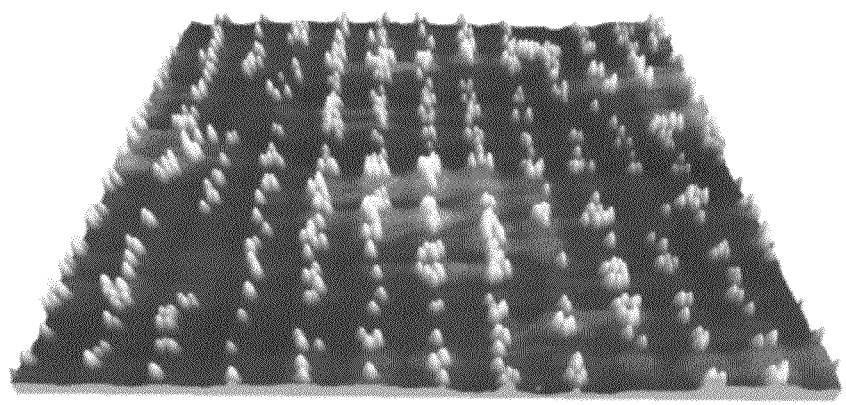
FIG. 12. AFM scan of InAs QDs grown on a patterned substrate with a period of 230 nm.

Before epitaxial overgrowth the patterned substrates have to be cleaned thoroughly using solvents. Any residual resist can be removed in oxygen plasma. Afterwards a HCl dip is performed followed by a rinse under DI water. The patterned and cleaned substrates are then inserted into the molecular beam epitaxy (MBE) chamber and the oxide can be removed thermally under an As4 overpressure. In situ reflection high energy electron diffraction (RHEED) can be used to monitor the substrate surface. To use the pattern information the QD growth has to start directly on the pattern, thick buffer layers would smooth the structure and result in random QD distributions. Typically, 20 nm of $In_{0.2}Ga_{0.8}As$ are grown followed by a 10 nm to 15 nm GaAs buffer layer. The QDs are grown at 500° C. to 510° C. with an InAs deposition of typically 0.5 nm. Using the growth scenario described above results in a flat surface on pre-patterned substrates with 20 nm deep patterns (FIG. 12).

Due to the underlying stressor layers formed by the first InGaAs the QDs are located not in the holes but at the local maxima of the pattern. In a coherent compressively strained film, the three-dimensional pattern creates a region of tensile stress at the local maxima and compressive stress at the local minima. Thickness and composition of this layer are crucial for avoiding film relaxation while still transferring the strain from the InGaAs layer to the GaAs buffer layer above, because the GaAs buffer is locally under tensile strain (larger lattice parameter) and thus it is energetically favorable for the InAs QDs to form there. This strain gradient creates a lower barrier to InAs QD nucleation closely matching the pattern. Compared to QDs grown on unpatterned substrates a higher QD density at the same InAs deposition can be shown. An improvement is anticipated by switching to an atomic hydrogen cleaning procedure.

Figure 11:
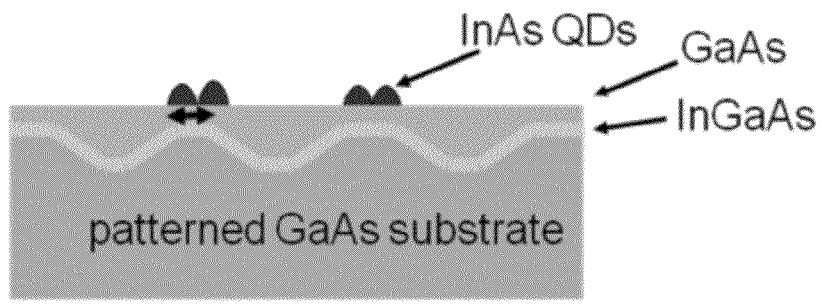
FIG. 11. Schematic view of an overgrown patterned substrate.

Clustering of QDs can be controlled by controlling the patterning profile, etch depth of the pattern and growth parameters of the epitaxial layer structure (see FIG. 11).

Figure 13:
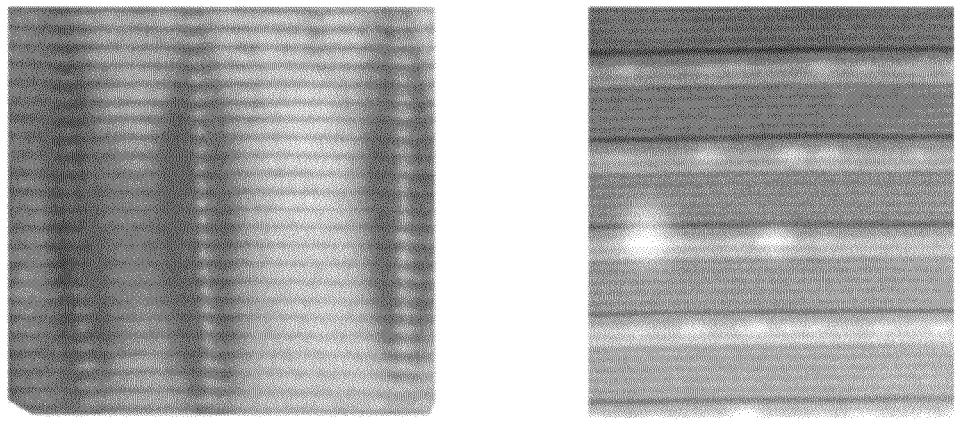
FIG. 13. (Left) Example of stacked QDs. (Right) Example of QD layers with a random quantum dot distribution.

FIG. 13 shows an AFM scan of a patterned substrate with a period of 230 nm overgrown with 20 nm $In_{0.2}Ga_{0.8}As$, 10 nm GaAs and 0.495 nm InAs. Due to preferential nucleation spots created by the template and the InGaAs layer, the dots align according to the pattern. Fabricating different pattern sizes and profiles allow different QD alignments from single QD ordering to clustering of QD arrays.

The vertical stacking of QDs within heterostructures can be controlled by varying the distance between multiple QD layers (FIG. 13). As a lower limit for the distance between subsequent QD layers stress relaxation and defect formation has to be taken into account. As an upper limit the lateral strain information is conserved only for a thickness of a few ten nm, thicker buffer layers or heterostructures between QD layers result in random QD distributions as can be seen on the right side of FIG. 13.

Photodetectors based on VC Q-BIC nanomaterial with specially engineered barriers have a strong potential to overcome limitations in quantum-well-based devices for IR imaging. VC Q-BIC material has advantages making it especially suitable for optoelectronic applications. First of all, there are various well-developed technologies for fabrication of such structures. Patterned surfaces with various pattern sizes and ratios of clusters versus non cluster areas may be used as templates to grow the correlated clusters with controllable parameters. Besides this, vertically correlated clusters create substantial and manageable barriers around clusters. These barriers prevent photoelectron capture and increase significantly the photoelectron lifetime. The long carrier lifetime leads to high responsivities, high operating temperatures, and low generation-recombination noise. Finally, tunable barriers provide intriguing possibilities to employ VCDC structure as adaptive IR sensors.

Other advantages of VC Q-BIC nanomaterials include: (i) flexibility—geometrical parameters of the structures can be changed in wide ranges, various materials can be used for dots and matrix; (ii) low cost and available fabrication technologies—the VCDC structures may be produced by available technologies; (iii) technological compatibility and scalability—the fabrication technology will enable larger format detector arrays for future imaging and solar cell applications.

While the invention has been particularly shown and described with reference to specific embodiments (some of which are preferred embodiments), it should be understood by those having skill in the art that various changes in form and detail may be made therein without departing from the spirit and scope of the present invention as disclosed herein.

What is claimed is:

1. A nanomaterial comprising:
a plurality of quantum dot layers, each quantum dot layer comprising a plurality of quantum dots disposed in an undoped semiconductor material;
wherein the plurality of quantum dots includes individual quantum dots, quantum dot clusters, or a combination of quantum dots and quantum dot clusters;
wherein adjacent quantum dot layers are separated by a spacer layer of n-doped semiconductor material having a thickness of 15 nm to 50 nm such that the quantum dots have built-in charge of at least two electrons per dot and no intermediate bands are formed, wherein at least 90% of the dopant is present in a discrete region of the spacer layer; and
wherein at least 50% of the individual quantum dots in adjacent quantum dot layers are vertically correlated or at least 50% of centers of the quantum dot clusters in adjacent quantum dot layers are vertically correlated.

2. The nanomaterial of claim 1, wherein the quantum dot clusters comprise from 2 to 15 quantum dots.

3. The nanomaterial of claim 1, wherein the nanomaterial comprises from 2 to 50 quantum dot layers.

4. The nanomaterial of claim 1, wherein the thickness of each of the quantum dot layers is from 2 nm to 10 nm.

5. The nanomaterial of claim 1, wherein the distance between nearest quantum dots in a quantum dot cluster is from 1 nm to 5 nm, the distance between the nearest quantum dots within the quantum dot cluster being the shortest distance from boundaries of the nearest quantum dots in the quantum dot cluster.

6. The nanomaterial of claim 1, wherein the distance between nearest quantum dot clusters is 3 to 5 times the distance between nearest quantum dots within the quantum dot clusters, the distance between the nearest quantum dot clusters being the shortest distance from the boundaries of the nearest quantum dot clusters, and the distance between the nearest quantum dots within each of the quantum dot clusters being the shortest distance from the boundaries of the nearest quantum dots.

7. The nanomaterial of claim 1, wherein the spacer layer of n-doped semiconductor material is n-doped at a level of at least three electrons per dot, at least four electrons per dot, at least five electrons per dot, or at least six electrons per dot.

8. The nanomaterial of claim 1, wherein the nanomaterial does not exhibit intermediate quantum dot bands, and wherein the relative full-width at half maximum of the distribution of QD length, width, or height is from 10% to 70%.

9. The nanomaterial of claim 1, wherein the quantum dots are InAs, GaAs, Ge, SiGe, CdS, InP, PbSe, GaN, or a combination thereof.

10. The nanomaterial of claim 1, wherein the n-doped semiconductor material in each spacer layer is individually GaAs, InP, Si, $BaF_2$, $CaF_2$, or SiC.

11. The nanomaterial of claim 1, wherein the n-doped semiconductor material of each of the quantum dot layers is individually GaAs, InP, Si, $BaF_2$, $CaF_2$, or SiC.

12. The nanomaterial of claim 1, wherein at least 50% of the individual quantum dots in adjacent quantum dot layers are vertically correlated and at least 50% of centers of the quantum dot clusters in adjacent quantum dot layers are vertically correlated.

13. The nanomaterial of claim 1, wherein at least 90% of the individual quantum dots in adjacent quantum dot layers are vertically correlated or at least 90% of centers of the quantum dot clusters in adjacent quantum dot layers are vertically correlated.

14. An optoelectronic device comprising the nanomaterial of claim 1.

15. The optoelectronic device of claim 14, wherein the optoelectronic device is a solar cell, photodetector device, or thermophotovoltaic device.

16. The optoelectronic device of claim 15, wherein the photodetector device is an infrared photodetector device or terahertz photodetector device.

\* \* \* \* \*